United States Patent [19]

Chao

[11] Patent Number: 4,837,180
[45] Date of Patent: Jun. 6, 1989

[54] LADDER GATE LDDFET
[75] Inventor: Fung-Ching Chao, Taiwan, China
[73] Assignee: Industrial Technology Research Institute, Taiwan, China
[21] Appl. No.: 72,086
[22] Filed: Jul. 9, 1987
[51] Int. Cl.⁴ .......................................... H01L 21/265
[52] U.S. Cl. ...................................... 437/44; 437/228; 437/229; 437/233; 437/186; 357/23.3; 156/643
[58] Field of Search ................... 437/41, 44, 154, 233, 437/229, 235, 238, 241, 243, 186, 228; 357/596, 23.3, 23.4, 23.9, 23.11, 91; 156/643, 650, 651, 652, 653; 148/DIG. 82, DIG. 83, DIG. 106, DIG 122

[56] References Cited

FOREIGN PATENT DOCUMENTS 0161282 12/1979 Japan .................................. 357/23.9
0062367 5/1981 Japan ..................................... 437/44
0141337 4/1982 Japan .
0220971 12/1984 Japan ..................................... 437/44
0055665 3/1985 Japan ..................................... 437/44

OTHER PUBLICATIONS

Ohta et al., "A Quadruply Self-Aligned MOA (QSA MOS) a New Short Channel High Speed High Density MOSFET for VLSI", IEDM 1979, pp. 581-584.
Huang et al., "A Novel Submicron LDD Transistor with Inverse-T Gate Structure", IEDM 1986, pp. 742-745.

Primary Examiner—Brian E. Hearn
Assistant Examiner—M. Wilczewski
Attorney, Agent, or Firm—Bert J. Lewen; Henry Sternberg

[57] ABSTRACT

A method of fabricating a lightly-doped drain field effect transistor (LDDFET) is disclosed. The initial steps include anisotropic polysilicon etching and isotropic photoresist erosion to obtain a ladder-shaped polysilicon gate. The polysilicon is partially oxidized and the source/drain region is formed by the implantation of a heavy dose of n-type ions. Thereafter, the silicon dioxide is removed and a lightly doped source/drain region formed by a second ion implantation between the gate region and the heavily doped source/drain region.

15 Claims, 7 Drawing Sheets

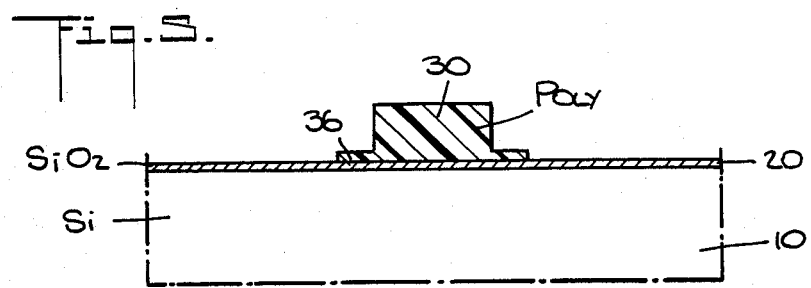
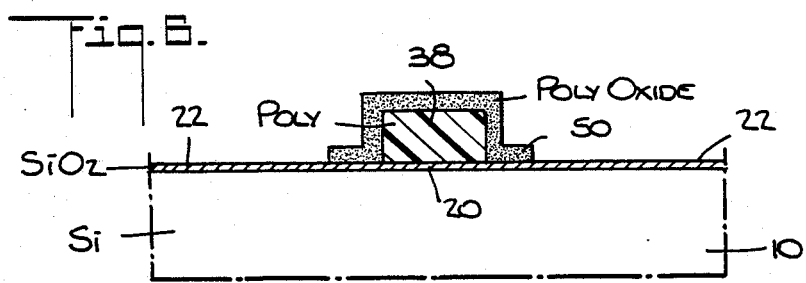
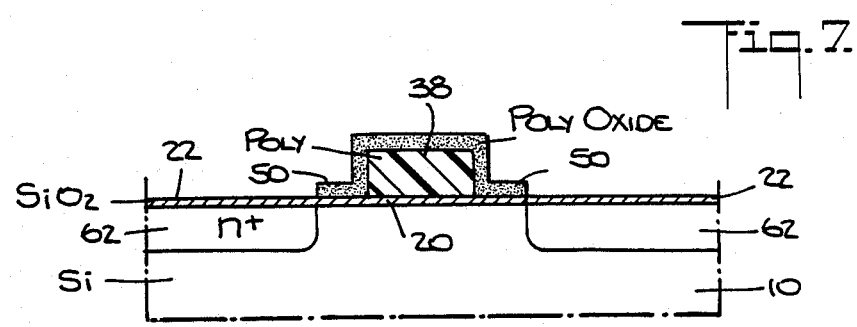
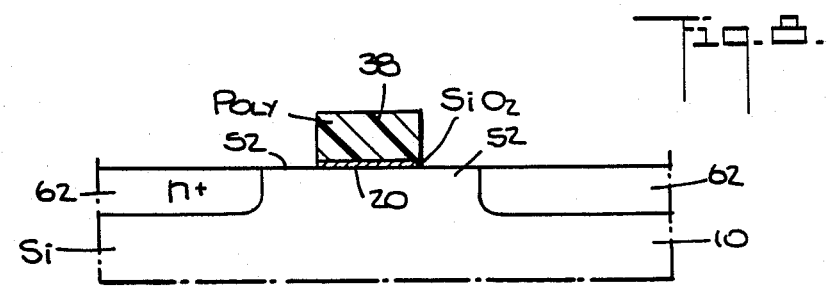

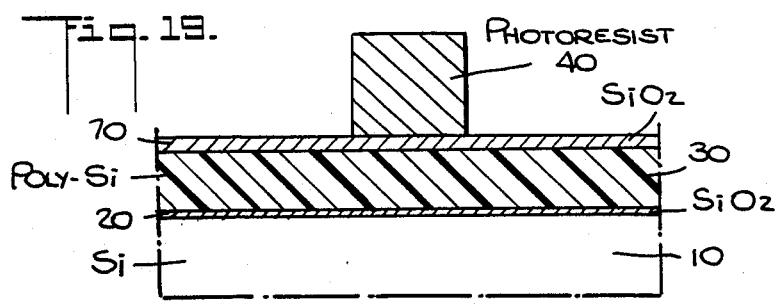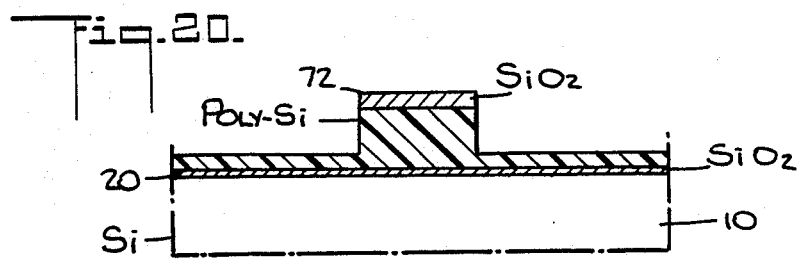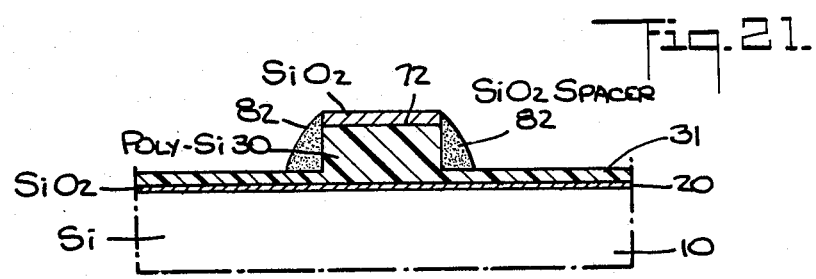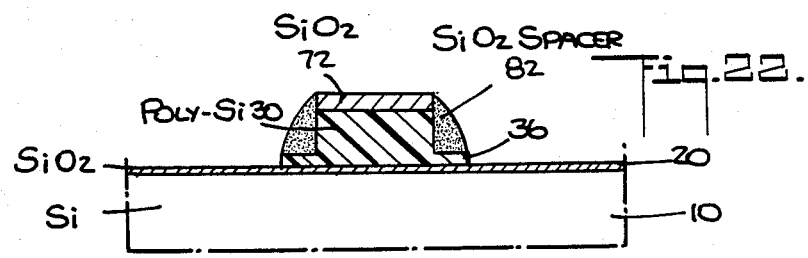

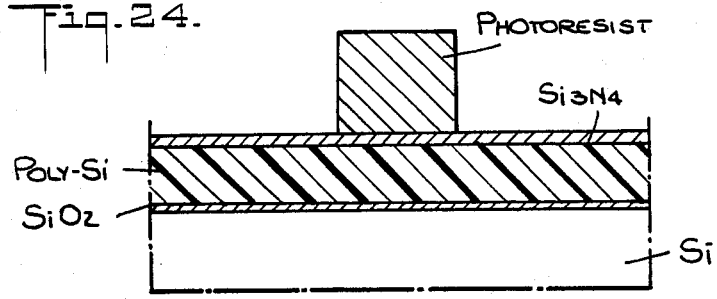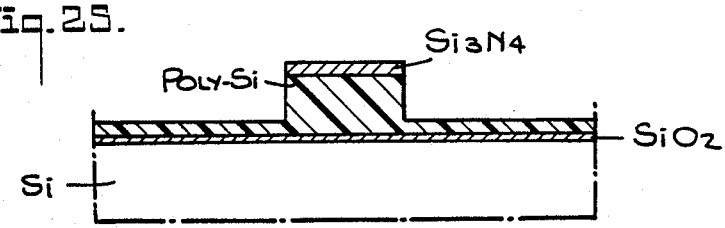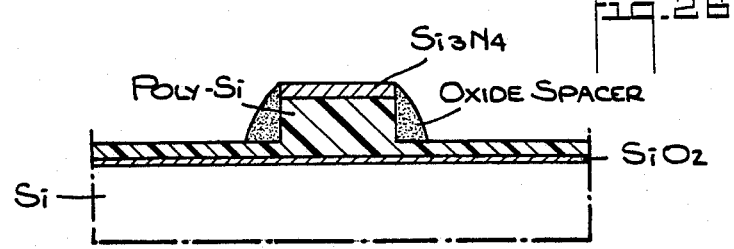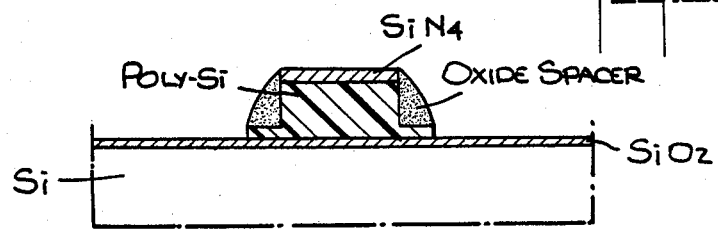

LADDER GATE LDDFET

BACKGROUND OF THE INVENTION

In order to achieve high circuit performance and density, MOSFET (metal-oxide-semiconductor field effect transistor) devices in silicon integrated circuit technology are scaled down to submicrometer range. In scaling down MOSFETs, the reduction of device dimensions is not accompanied by a corresponding reduction in power requirements. As a result, NMOS (n-channel MOS) devices are susceptible to channel hot-electron (CHE) instability. See Chenming Hu et al., "Hot-Electron-Induced MOSFET Degradation—Model, Monitor and Improvement," *IEEE Transactions on Electron Devices*, Vol. ED-32, No. 2 (Feb. 1985), pp. 375-385. The instability is caused by the very high electric field near the drain junction resulting from the short channel length and high supply voltage.

To alleviate the high electric field at the reduced MOSFET channel length, lightly doped drain (LDD) devices have been proposed. See K. Saito et al, "A New Short Channel MOSFET with Lightly Doped Drain," *Denshi Tsushin Rengo Taikai* (in Japanese) (April 1978), p. 220. In the LDD structure, narrow, self-aligned, $n^-$ regions are introduced between the channel and the $n^+$ source/drain regions. The $n^-$ region spreads the high electric field out near the drain junction, allowing the device to be operated at a higher supply voltage with fewer hot-electron problems.

Several processes for fabricating lightly-doped drain field effect transistor (LDDFET) have been proposed. Spacer and overhang techniques are most commonly adopted. The spacer technique involves a reactive-ion etching (RIE) step after silicon dioxide is chemical vapor deposited to form sidewall oxide spacers. Oxide spacers are used to mask the heavy and deep implant of the $n^+$ drain/source regions after the formation of the shallow $n^-$ drain/source regions. See FIG. 2, p. 590, of Paul J. Tsang et al., "Fabrication of High-Performance LDDFET's with Oxide Sidewall-Spacer Technology," *IEEE Transactions on Electron Devices*, Vol. ED-29, No. 4 (April 1982). The overhang technique involves a polysilicon over-etching step after $SiO_2/Si_3N_4$/poly-Si/$SiO_2$ gate stack is patterned to form $SiO_2/Si_3N_4$ overhangs. $SiO_2/Si_3N_4$ overhangs are used to mask the heavy and deep implant of the $n^+$ drain/source regions followed by the formation of the shallow $n^-$ drain/source regions. See FIG. 2, p. 1360, of Seiki Ogura et al., "Design and Characteristics of the Lightly Doped Drain-Source (LDD) Insulated Gate Field-Effect Transistor," *IEEE Transactions on Electron Devices*, Vol. ED-27, No. 8 (Aug. 1980).

Two alternative structures, buried LDD and graded/buried LDD structures, adopting sidewall oxide spacer technology, have also been demonstrated. See Ching-Yeu Wei et al., "Buried and Graded/Buried LDD Structures for Improved Hot-Electron Reliability," *IEEE Electron Device Letters*, Vol. EDL-7, No. 6 (June 1986), pp. 380-382. In the spacer technology, additional oxide deposition and oxide etch-back processes are needed. In the overhang technology, additional $Si_3N_4/SiO_2$ deposition and polysilicon over-etching processes are required. In addition, these two processes are far too complicated for commercial application.

Still another method described is the so-called self-defined polysilicon sidewall (SEPOS) technique which uses $SiO_2$ at the vertical sides of the polysilicon to define the oxide-framed polysilicon sidewall. See FIG. 1, p. 2463, of M. Saitoh, "Degradation Mechanism of Lightly Doped Drain (LDD) n-Channel MOSFET's Studied by Ultraviolet Light Irradiation," *J. Electrochem. Soc.: Solid-State Science and Technology*, Vol. 132, No. 10 (Oct. 1985), pp. 2463-2466.

Also proposed has been the self-aligned polysilicon source/drain (SAPSD) technique which uses a $n^+$ polysilicon source/drain layer to allow the dopants to diffuse into the substrate to form the $n^-$ region. See FIG. 1, p. 314, of Tiao-Yuan Huang et al., "A MOS Transistor with Self-Aligned Polysilicon Source-Drain," *IEEE Electron Device Letters*, Vol. EDL-7, No. 5 (May 1986), pp. 314-316.

The inverse-T LDD (ITLDD) transistor has also been proposed. This transistor uses a sidewall oxide spacer to define the $n^-$ region. See FIG. 2, page 743, of Tiao-Yuan Huang et al., "A Novel Submicron LDD Transistor with Inverse-T Gate Structure," *IEDM 86* (International Electron and Device Meeting 1986), Sec. 31.7, pp. 742-745. Unfortunately, all of these techniques are too difficult because of the complexity of the processes.

In addition, a new LDD structure for NMOS FET has also been demonstrated. It may be made using a single ion implantation step to form $n^-$ regions due to the sloped sidewall of the structure. See FIG. 1, p. 28, of "A New Structure LDD for NMOSFET," *Japan Semiconductor News*, Vol. 3, No. 3 (June 1984), pp. 27-28. Unfortunately, the gate of the FET is much higher than source/drain regions.

SUMMARY OF THE INVENTION

The present invention relates to a technique of fabricating a lightly-doped drain field effect transistor (LDDFET).

A high quality silicon dioxide layer is thermally grown on silicon wafer, and a polysilicon layer is then deposited over the thermal oxide gate-forming layer. A $n^+$ diffusion step is performed to dope the polysilicon layer. The photoresist mask having a polysilicon gate pattern is then applied using conventional photoresist coating and optical lithography techniques.

A first partial polysilicon etching step is performed in which the polysilicon is anisotropically etched a proper thickness. Then the photoresist masking layer is isotropically etched (eroded) to expose part of the un-etched polysilicon layer. After the photoresist masking layer is eroded, a second polysilicon etching step is performed until all of the remaining polysilicon on source and drain regions is removed to complete the formation of the ladder polysilicon gate.

The photoresist masking layer is stripped and a polysilicon oxidation step performed to oxidize the remaining thin steps of polysilicon completely. Thereafter, a heavy n-type ion implantation process is performed to form the source/drain regions. The silicon dioxide layer is removed and a light n-type dose ion implantation process performed to form the lightly-doped source/drain regions between the source/drain regions and the gate region. The LDDFET is then fabricated according to conventional procedures.

DESCRIPTION OF THE DRAWINGS

FIGS. 1 to 9 show transverse sectional views of the structure formed at various stages in the fabrication of the LDDFET in accordance with a first embodiment of the invention.

FIG. 1 shows the structure after the initial coating steps wherein the silicon wafer is first coated with a thin, thermally-coated silicon dioxide layer and a n-doped polysilicon layer having on top of it a defined photoresist mask layer with the gate pattern.

FIG. 2 shows the structure after the anisotropic etch of a part of the polysilicon layer.

FIG. 3 shows the structure after the isotropic etch of part of the photoresist masking layer showing selected portions of the unetched polysilicon layer exposed.

FIG. 4 shows the structure after the anisotropic etch of the polysilicon layer outside the gate region to expose the source/drain regions.

FIG. 5 illustrates the structure after the removal of the photoresist masking layer. The ladder polysilicon gate is shown.

FIG. 6 illustrates the structure after the oxidation of the polysilicon layer. The thin polysilicon steps are oxidized completely.

FIG. 7 shows the structure being implanted with a heavy dose of ions. The source and drain regions which are formed are illustrated.

FIG. 8 shows the structure after the removal of the silicon dioxide layer.

FIG. 9 shows the structure after lightly doped source/drain regions are formed.

A second embodiment of the invention is described in FIGS. 10–18.

Figure 10:
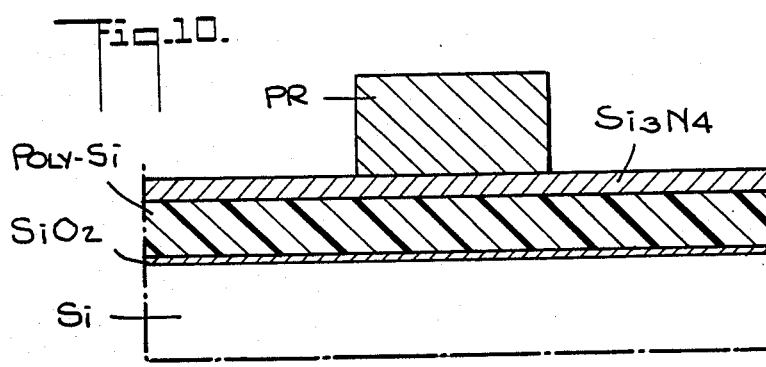

FIG. 10 shows the structure after the initial coating steps wherein the silicon wafer is first coated with a thin, thermally-coated silicon dioxide layer, a n-doped polysilicon layer, and a silicon nitride layer having on top of it a defined photoresist mask layer with the gate pattern.

Figure 11:
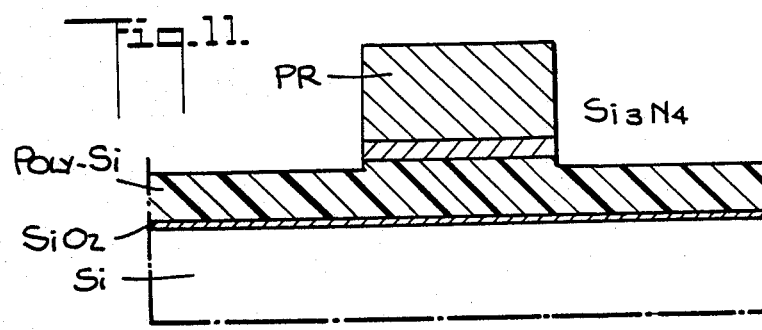

FIG. 11 shows the structure after the anisotropic etch of the silicon nitride layer and a part of the polysilicon layer.

Figure 12:
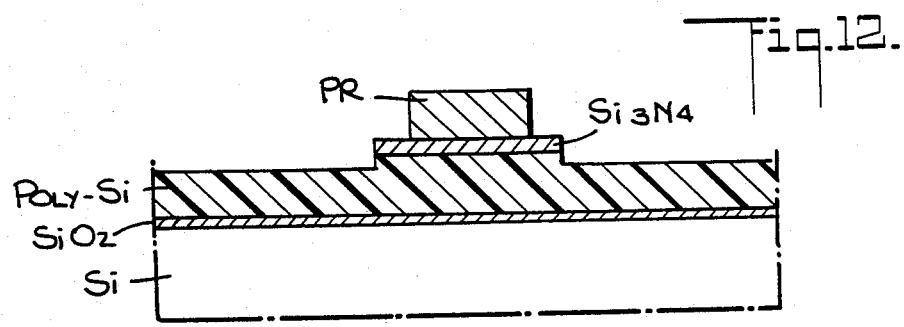

FIG. 12 shows the structure after the isotropic etch of part of the photoresist masking layer showing selected portions of the unetched silicon nitride layer exposed.

Figure 13:
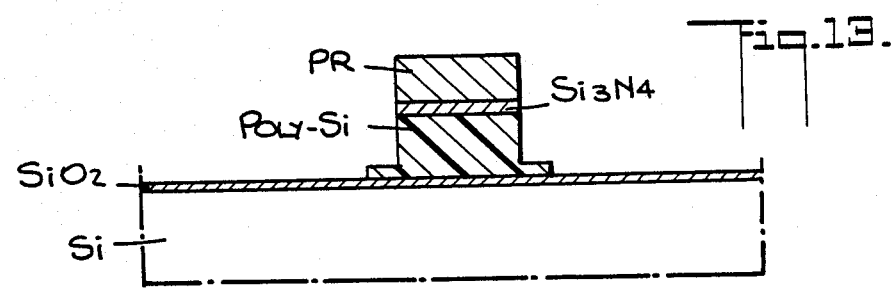

FIG. 13 shows the structure after the anisotropic etch of the silicon nitride layer and the portion of the polysilicon layer outside the gate region.

Figure 14:
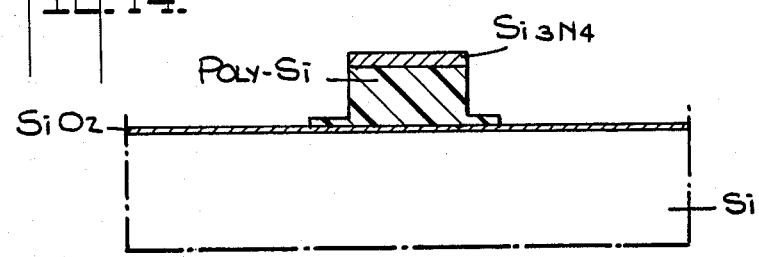

FIG. 14 illustrates the structure after the removal of the photoresist masking layer. The ladder polysilicon gate with silicon nitride covering the gate region is shown.

Figure 15:
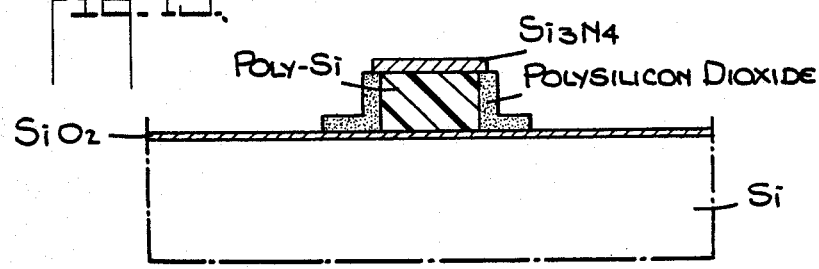

FIG. 15 shows the structure resulting from the oxidation of the outer surface of the polysilicon. The steps are completely oxidized and sidewall polysilicon dioxide spacers are formed.

Figure 16:
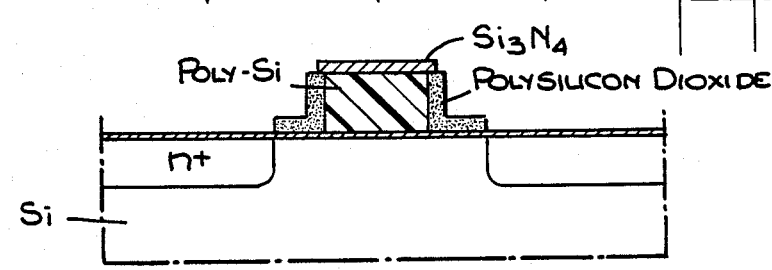

FIG. 16 shows the implantation with a heavy dose of ions. The source and drain regions which are formed are illustrated.

Figure 17:
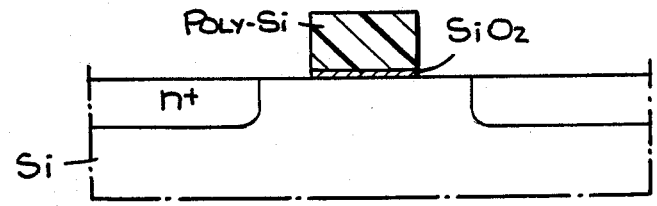

FIG. 17 shows the structure after the removal of the silicon dioxide and silicon nitride layers.

Figure 18:
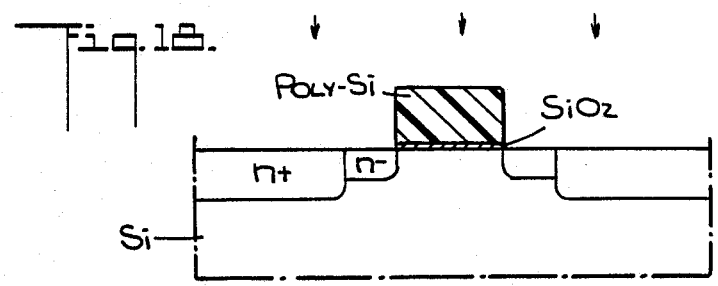
Figure 29:
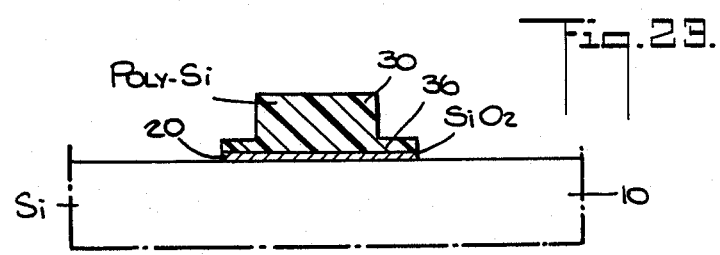

FIG. 18 shows the structure being doped to form the lightly-doped source/drain regions.

A third embodiment of the invention is shown in FIGS. 19 through 23.

FIG. 19 shows the structure after initial coating steps wherein the silicon wafer is first coated with a thin silicon dioxide layer, an n-doped polysilicon layer, a second thin silicon dioxide layer, and a defined photoresist mask layer with a gate pattern.

FIG. 20 illustrates the structure remaining after the structure shown in FIG. 19 has been anisotropically etched to remove completely the unmasked upper silicon dioxide layer and to remove partially the polysilicon layer.

FIG. 21 shows the structure after the formation of silicon dioxide spacers.

FIG. 22 illustrates the remaining structure after an anisotropic etching step completely removes the unmasked portion of the polysilicon layer.

FIG. 23 illustrates the structure after the removal of the silicon dioxide spacers and the unmasked portion of the first silicon dioxide layer.

A fourth embodiment of the invention is shown in FIGS. 24 through 28.

FIG. 24 shows the structure after initial coating steps wherein the silicon wafer is first coated with a thin silicon dioxide layer, an n-doped polysilicon layer, a silicon nitride layer, and a defined photoresist mask layer with a gate pattern.

FIG. 25 illustrates the structure remaining after the structure shown in FIG. 19 has been anisotropically etched to remove completely the unmasked silicon nitride layer and partially remove the polysilicon layer.

FIG. 26 shows the structure after the formation of silicon dioxide spacers.

FIG. 27 illustrates the remaining structure after an anisotropic etching step completely removes the unmasked portion of the polysilicon layer.

Figure 28:
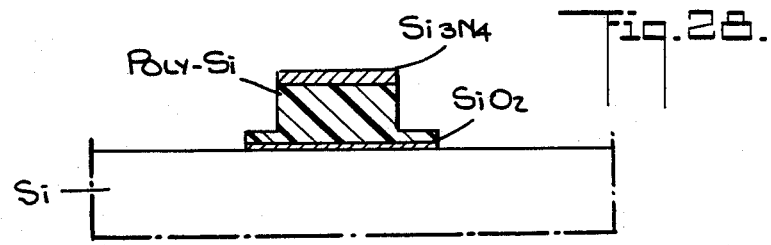

FIG. 28 illustrates the structure after the removal of the silicon dioxide spacers and the unmasked portion of the silicon dioxide layer.

DESCRIPTION OF THE PREFERRED EMBODIMENT

According to the present invention, an improved method is provided to fabricate the lightly doped drain field effect transistor (LDDFET). This technique finds particular application in the processing of silicon wafers for integrated circuit chips. Accordingly, the invention will be described for this particular application.

Figure 1:
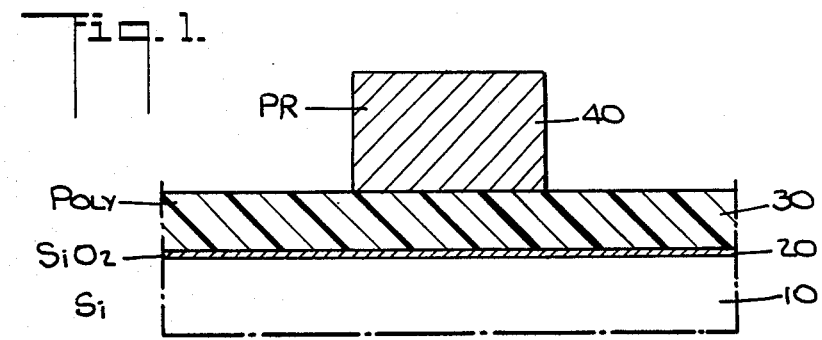

Referring now to the drawings, FIG. 1 shows a section through the silicon wafer after the initial processing steps. The silicon wafer, designated by the reference character 10, has grown thereon a thin film of silicon dioxide ($SiO_2$), 20. On top of the $SiO_2$ is a layer of doped polysilicon, 30, which has been doped using conventional chemical vapor deposition (CVD) or a diffusion process. On top of the polysilicon 30 is a photoresist masking layer having a polysilicon gate pattern, 40. This pattern is defined using standard photoresist coating, exposure and development processes.

Figure 2:
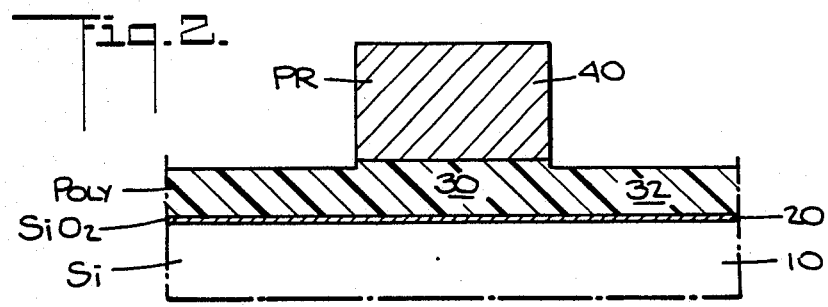

FIG. 2 shows the resulting structure after the unmasked portions of polysilicon 30 are partially etched anisotropically. The anisotropic etching can be performed using a dry etching process. For example, the polysilicon etch is preferably performed by introducing 65 SCCM (standard cubic centimeters per minute) of Ar and 20 SCCM of $NF_3$ gases into AME-8110 system (trademark of Applied Material Co.) at a pressure of 40 milli-torr and a D.C. bias of −230 V. The etch rate is about 250±15 Angstroms/min. The amount of the polysilicon layer removed is carefully determined, typically 700 Angstroms. The remainder of the unmasked polysilicon layer, designated by the reference character 32, is left on the silicon dioxide.

Figure 3:
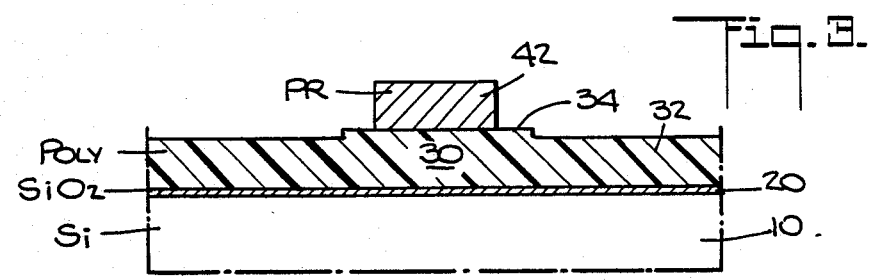

FIG. 3 shows the resulting structure after the photoresist masking layer is isotropically etched. This etch step exposes the desired portion of the etch-resistant polysilicon 30. The isotropic etching can be performed using dry etching process, for example, by introducing 50 SCCM of $O_2$ gas into AME-8110 system, at a pressure of 100 milli-torr and a power of 300 watts to etch the photoresist at a lateral rate of about $800\pm30$ Angstroms/min. The remaining portion of photoresist masking layer 40 is designated by the reference character 42. The remaining portion of the unetched polysilicon 30 is designated by the reference character 34.

Figure 4:
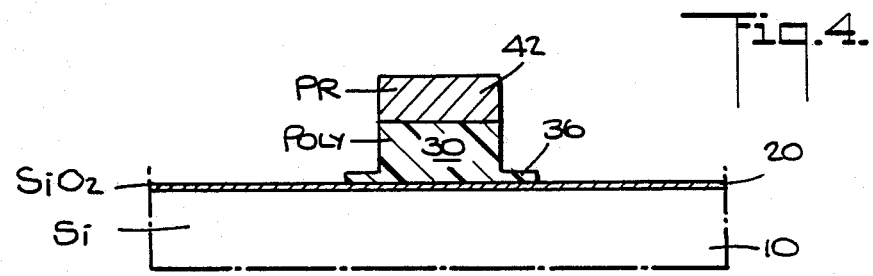

FIG. 4 shows the structure after a portion of polysilicon layer 32 is removed completely by anisotropic etching using a AME-8110 system. As can be seen, there is formed a polysilicon "step," designated by the reference character 36, which surrounds the bottom of the polysilicon gate 30, the latter being under the eroded photoresist masking layer 42. The polysilicon step 36 is the remainder of the exposed unetched polysilicon 34 after the first polysilicon anisotropic etching. The length of this step corresponds to the length of lightly-doped regions and is in the range of 0.25 –0.30 micrometer for standard applications. The thickness of polysilicon step 36 is, making reference to FIG. 2, equal to the difference between the thickness of unetched polysilicon gate 30 and the thickness of the partially etched polysilicon 32, i.e., the thickness of the polysilicon removed in the first polysilicon etching procedure. As stated above, the thickness of polysilicon step 36 is, in this example, 700 Angstroms.

FIG. 5 shows the resulting structure after the photoresist masking layer 42 is removed using, for example, a sulfuric acid stripping solution. As can be seen, the polysilicon gate is ladder-shaped, i.e., has the step 36. This is an essential feature in the process for making an LDDFET.

FIG. 6 illustrates the structure after the polysilicon layer is oxidized. The oxidation completely oxidizes the thin polysilicon steps 36. The thickness of the oxidized step 50 is about twice the thickness of the unoxidized material 36. The thickness of the oxide must be sufficient to mask the silicon during the source/drain implantation step. For example, if a 60 kilo-electron-volt (KeV) arsenic dopant implantation is to be used, a 1400 Angstroms silicon dioxide must be formed. The polysilicon gate 30 is also oxidized during this step and, as can be seen in FIG. 6, the resulting polysilicon gate 38 is thinner. This polysilicon oxidation step may be performed in the ambient of 5 min. $O_2$+45 min. $O_2$ & HCL+15 min. $N_2$ at 920° C. in a furnace.

It should also be noted that the silicon dioxide layer 22 is thicker due to the oxidation of silicon at source/drain regions. This thickness is controlled so that the projected range of arsenic in silicon dioxide is sufficient to allow the peak of the dose distribution penetrating into the silicon to form source/drain regions. If the thickness of the silicon dioxide 22 is thicker than that of the projected range of arsenic in silicon dioxide, an etch using diluted hydrogen fluoride solution may be used.

FIG. 7 shows the resulting structure after the source/drain region is heavily dosed by an ion implantation process. The portions not covered by the polysilicon oxide form the highly-doped source/drain regions 62. As mentioned above, for an arsenic dopant, $6\times10^{15}$ doses/cm$^2$ at 60 KeV energy is used in the source/drain ion implantation process.

FIG. 8 shows the resulting structure after the silicon dioxide layers 22 and 50 are removed. These layers may be removed by etching with a buffered oxide etchant or a diluted hydrogen fluoride solution. The lengths of the regions 52 between the polysilicon gate 38 and source/drain regions 62 are equal, and ready to be formed into the lightly-doped regions.

Figure 9:
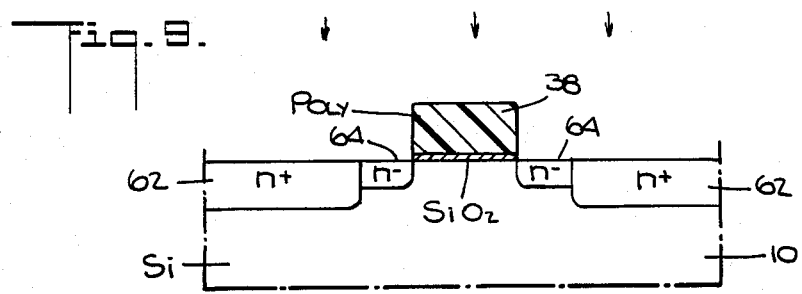

FIG. 9 shows the resulting LDDFET structure after the lightly-dosed source/drain ion implantation step is performed. The conditions of the light dose source/drain ion implantation step, for example, are $1\times10^{13}$ dose/cm$^2$, phosphorus at 50 KeV. As can be seen, the lightly-doped source/drain regions 64 are self-aligned.

The key features of the LDDFET are now achieved. By performing conventional low temperature oxidation, contact window opening, metallization and passivation processes, the LDDFET is ready for practical applications.

As a further embodiment of the invention, the process described above can be modified by adding a silicon nitride layer on the polysilicon layer. By applying the anisotropic film etching and the isotropic photoresist etching, a ladder-shaped polysilicon gate covered with silicon nitride can be obtained. The silicon nitride serves as oxidation resisting layer to prevent the oxidation of the top of the gate. This avoids any possible decrease in the thickness of the polysilicon gate.

The fundamental steps of this embodiment are shown in FIGS. 10–18. Since the specific processing steps are readily understood from the description of FIGS. 1–9 (that is, the first embodiment of the invention), in discussing these figures reference will be made only to the significant modifications. As will be noted from FIG. 10, prior to the formation of the photoresist a silicon nitride layer is deposited atop the polysilicon layer. This layer may be deposited using conventional low pressure chemical vapor deposition (LPCVD) or plasma-enhanced chemical vapor deposition (PECVD). Thereafter, an anisotropic etching step is performed using reactive-ion etching process to completely remove the unmasked silicon nitride and partially removed the unmasked polysilicon.

The anisotropic etching can be performed using the reactive-ion etching system, for example, the AME-8110 system. The silicon nitride etching is performed using 60 SCCM of $CHF_3$ and 35 SCCM of $O_2$ at a pressure of 40 milli-torr and a power of 600 watts. This gives an etch rate of about $630\pm10$ Angstroms/min. For polysilicon etching, 65 SCCM of Ar and 20 SCCM of $NF_3$, a pressure of 40 milli-torr and a D.C. bias of $-230$ V are preferred, with the etch rate being about $250\pm15$ Angstroms/min.

After the mask erosion step, the structure shown in FIG. 12 is formed. This step is comparable to that shown in FIG. 3 of the first embodiment of the invention. The structure in FIG. 13 is achieved after a second anisotropic etching step under conditions comparable to those discussed above, except here the etching is continued until all of the unmasked polysilicon is removed except for a thin, typically 700 Angstrom, peripheral step of polysilicon surrounding the gate region. FIGS. 14 and 15 show the structure after the removal of the photoresist and the oxidation of the polysilicon, respectively. It will be recognized that the structure shown in FIG. 15 is comparable to that illustrated in FIG. 6, except that silicon nitride covers the central polysilicon layer rather than polysilicon oxide shown in FIG. 6. The further steps in the process include the heavy ion implantation step shown in FIG. 16 to form the heavily doped source and drain regions, the removal of the silicon nitride layer and the silicon dioxide shown in FIG. 17, and finally the light ion implantation step shown in FIG. 18, the latter being comparable to that shown in FIG. 9 of the first embodiment.

Third and fourth embodiments of the invention are shown in FIGS. 19-23 and 24-28. Basically, the steps illustrated serve to form a structure comparable to that formed in FIG. 5 of the first embodiment of the invention. The third and fourth embodiments differ fundamentally in that, in the fourth embodiment, as shown in FIG. 24, a silicon nitride layer is placed atop of the polysilicon layer, while in the third embodiment a second silicon dioxide layer 70 is used (FIG. 19). The key variation in these embodiments is the formation of oxide spacers after the anisotropic etching of the unmasked silicon dioxide or silicon nitride layer, as the case may be, and the partial removal of the polysilicon layer shown in FIGS. 20 and 25. This oxide spacer, illustrated in FIGS. 21 and 26, is formed by CVD oxide deposition and anisotropic etching. The spacer is designated by the character 82 on FIG. 21. The structure shown in FIGS. 21 and 26 is subject to anisotropic etching to completely remove the unmasked portion 31 of the polysilicon layer. The residual "step" 36 remains under the oxide sidewall spacer. FIGS. 23 and 28 illustrate the structure remaining after an isotropic oxide etching process removes the spacers and the unmasked portion of the silicon dioxide. The ladder-shaped polysilicon gates formed, as shown in FIGS. 23 and 28, are thereafter subjected to the polysilicon oxidation, heavy ion implantation step, oxide removal step, and light implantation step described in the first and second embodiments of the invention.

The foregoing description is for purposes of illustration only. It will be readily understood that many variations thereof, which will not depart from the spirit of the invention, will be apparent to those skilled in the art.

What is claimed is:

1. A lightly-doped drain field effect transistor fabrication process, which comprises:
   (A) forming, on a semiconductor substrate having a silicon dioxide layer grown thereon, a ladder-shaped polysilicon layer having a thick central gate region and a relatively thin peripheral step;
   (B) oxidizing completely said thin peripheral step portion and the outer portion of the thick central gate region to form additional silicon dioxide, said additional silicon dioxide serving to thicken the silicon dioxide layer about the periphery of the gate region;
   (C) ion-implanting a heavy N-type dose so as to form source/drain regions in said substrate;
   (D) etching the resulting structure to remove the additional silicon dioxide and silicon dioxide layer; and
   (E) ion-implanting the substrate with a light dose of N-type ions to form lightly doped source/drain extensions between said heavily doped source/drain regions and said gate region.

2. A lightly-doped drain field effect transistor fabrication process, which comprises:
   (A) forming, on a semiconductor substrate having silicon dioxide grown thereon, a ladder-shaped polysilicon layer having a thick central gate region covered with silicon nitride and a relatively thin peripheral step;
   (B) oxidizing completely said thin peripheral step portion and the outer portion of the thick central gate region to form additional silicon dioxide, said additional silicon dioxide serving to thicken the silicon dioxide layer about the periphery of the gate region;
   (C) ion-implanting a heavy N-type dose so as to form source/drain regions in said substrate;
   (D) removing the silicon nitride layer;
   (E) etching the resulting structure to remove the additional silicon dioxide and silicon dioxide layer; and
   (F) ion-implanting the substrate with a light dose of N-type ions to form lightly doped source/drain extensions between said heavily doped source/drain regions and said gate region.

3. The process of claim 2 wherein the silicon nitride is removed after the silicon dioxide is removed.

4. An n-channel LDDFET made by the process of claim 1 or 2.

5. The process of claim 1 or 2 wherein the dopant is arsenic or phosphorus.

6. A lightly doped drain field effect transistor fabrication process, which comprises:
   (A) thermally growing a first silicon dioxide layer on a semiconductor substrate;
   (B) depositing an N+-doped polysilicon layer on the first silicon dioxide layer;
   (C) forming a photoresist mask to define a masked transistor gate pattern on a portion of said polysilicon layer;
   (D) removing unmasked portions of the polysilicon layer partially by anisotropic etching;
   (E) eroding said photoresist mask by isotropic etching to expose a selected portion of the masked polysilicon layer;
   (F) removing the partially-etched polysilicon completely and the exposed portion of the polysilicon layer partially by anisotropic etching;
   (G) removing the photoresist mask to form a ladder-shaped polysilicon layer having a thick central gate region and a relatively thin peripheral step;
   (H) oxidizing completely said thin peripheral step portion and the outer portion of the thick central gate region to form a second silicon dioxide layer serving to thicken the first silicon dioxide layer about the periphery of the gate region;
   (I) ion-implanting a heavy N-type dose so as to form source/drain regions in said substrate;
   (J) etching the resulting structure to remove the second silicon dioxide layer and the first silicon dioxide layer; and
   (K) ion implanting the substrate with a light dose of N-type ions to form lightly-doped source/drain extensions between said heavily-doped source/drain regions and said gate region.

7. A lightly-doped drain field effect transistor fabrication process, which comprises:
   (A) thermally growing a first silicon dioxide layer on a semiconductor substrate;
   (B) depositing an N+-doped polysilicon layer on the first silicon dioxide layer;
   (C) depositing a silicon nitride layer on the polysilicon layer;
   (D) forming a photoresist mask to define a masked transistor gate pattern on said silicon nitride layer;
   (E) removing unmasked portions of the silicon nitride layer completely and the polysilicon layer partially by anisotropic etching;

(F) eroding said photoresist mask by isotropic etching to expose a selected portion of the masked silicon nitride layer;

(G) removing the exposed silicon nitride layer and the partially-etched polysilicon layer completely by anisotropic etching;

(H) removing the photoresist mask to form a ladder-shaped polysilicon layer having a thick central gate region covered with silicon nitride and a relatively thin peripheral step;

(I) oxidizing completely said thin peripheral step portion and the outer portion of the thick central gate region to form a second silicon dioxide layer, said second silicon dioxide layer serving to thicken the first silicon dioxide layer about the periphery of the gate region;

(J) ion implanting a heavy N-type dose so as to form source/drain regions in said substrate;

(K) removing the silicon nitride layer;

(L) etching the resulting structure to remove the second silicon dioxide layer and the first silicon dioxide layer; and (M) ion implanting the substrate with a light dose of N-type ions to form lightly-doped source/drain extensions between said heavily-doped source/drain regions and said gate region.

8. The process of claim 1 wherein the isotropic etching is dry etching.

9. A lightly-doped drain field effect transistor fabrication process, which comprises:

(A) thermally growing a first silicon dioxide layer on a semiconductor substrate;

(B) depositing an N+-doped polysilicon layer on the first silicon dioxide layer;

(C) depositing an oxide layer on the polysilicon layer;

(D) forming a photoresist mask to define a masked transistor gate pattern on a portion of said oxide layer;

(E) removing unmasked portions of the oxide layer by anisotropic etching and stripping the photoresist mask;

(F) removing the polysilicon layer incompletely by anisotropic etching;

(G) forming an oxide sidewall spacer by depositing an oxide layer and anisotropically etching said layer;

(H) removing unmasked portions of the polysilicon layer completely by anisotropic etching;

(I) removing the oxide side wall spacer and exposed portions of the first silicon dioxide layer by an etching process to form a ladder-shaped polysilicon layer having a thick central gate region and a relatively thin peripheral step;

(J) oxidizing completely said thin peripheral step portion and the outer portion of the thick central gate region to form a second silicon dioxide layer, said second silicon dioxide layer serving to thicken the first silicon dioxide layer about the periphery of the gate region;

(K) ion implanting a heavy N-type dose so as to form source/drain regions in said substrate;

(L) etching the resulting structure to remove the second silicon dioxide layer and the first silicon dioxide layer; and (M) ion implanting the substrate with a light dose of N-type ions to form lightly-doped source/drain extensions between said heavily-doped source/drain regions and said gate region.

10. A lightly-doped drain field effect transistor fabrication process, which comprises:

(A) thermally growing a first silicon dioxide layer on a semiconductor substrate;

(B) depositing an N+-doped polysilicon layer on the first silicon dioxide layer;

(C) depositing a silicon nitride layer on the polysilicon layer;

(D) forming a photoresist mask to define a masked transistor gate pattern on said silicon nitride layer;

(E) removing unmasked portions of the silicon nitride layer by anisotropic etching and stripping the photoresist mask;

(F) etching the polysilicon layer incompletely by anisotropic etching;

(G) forming an oxide sidewall spacer by depositing an oxide layer and anisotropically etching said layer;

(H) removing unmasked portions of the polysilicon layer completely by anisotropic etching;

(I) removing the oxide sidewall spacer and exposed portions of the first silicon dioxide layer to form a ladder-shaped polysilicon layer having a thick central gate region covered with silicon nitride and a relatively thin peripheral step;

(J) oxidizing completely said thin peripheral step portion and the outer portion of the thick central gate region to form a second silicon dioxide layer, said second silicon dioxide layer serving to thicken the first silicon dioxide layer about the periphery of the gate region;

(K) ion implanting a heavy N-type dose so as to form source/drain regions in said substrate;

(L) removing the silicon nitride layer;

(M) etching the resulting structure to remove the second silicon dioxide layer and the first silicon dioxide layer; and (N) ion implanting the substrate with a light dose of N-type ions to form lightly-doped source/drain extensions between said heavily-doped source/drain regions and said gate region.

11. The process of claim 1 wherein the N+ doped polysilicon is doped in situ or by a diffusion process.

12. The process of claim 1 wherein the anisotropic etching is reactive-ion etching.

13. The process of claim 1 or 2 wherein the etching of the oxide layers is with a buffered oxide etchant or a diluted hydrogen fluoride solution.

14. The process of claim 2 wherein silicon nitride is deposited by LPCVD or PECVD.

15. The process of claim 1 or 2 wherein the semiconductor substrate is p-type silicon wafer.

* * * * *